(12) United States Patent
Liu

(10) Patent No.: US 9,753,069 B2
(45) Date of Patent: Sep. 5, 2017

(54) INSULATION RESISTANCE DETECTION METHOD AND CIRCUIT FOR UNGROUNDED DC POWER SUPPLY SYSTEM

(71) Applicants: KAO YUAN UNIVERSITY, Kaohsiung (TW); ALFA POWER CO., LTD., New Taipei (TW)

(72) Inventor: Yow-Chyi Liu, Kaohsiung (TW)

(73) Assignees: KAO YUAN UNIVERSITY, Kaohsiung (TW); ALFA POWER CO., LTD., New Taipei (TW)

(*) Notice: Subject to any disclaimer, the term of this patent is extended or adjusted under 35 U.S.C. 154(b) by 153 days.

(21) Appl. No.: 14/673,379

(22) Filed: Mar. 30, 2015

(65) Prior Publication Data

US 2015/0285850 A1 Oct. 8, 2015

(30) Foreign Application Priority Data

Apr. 8, 2014 (TW) .............................. 103112823 A

(51) Int. Cl.
*G01R 27/02* (2006.01)
*G01R 27/18* (2006.01)
*G01R 31/02* (2006.01)
*G01R 31/00* (2006.01)
*G01R 31/40* (2014.01)

(52) U.S. Cl.
CPC ............ *G01R 27/025* (2013.01); *G01R 27/18* (2013.01); *G01R 31/006* (2013.01); *G01R 31/025* (2013.01); *G01R 31/40* (2013.01)

(58) Field of Classification Search
CPC ...... G01R 27/18; G01R 31/025; G01R 31/40; G01R 31/006; G01R 27/025
USPC ......................................................... 324/509
See application file for complete search history.

(56) References Cited

U.S. PATENT DOCUMENTS

| | | | | |
|---|---|---|---|---|
| 2,989,694 A | * | 6/1961 | Fath ........................ | G01R 27/18 324/509 |
| 3,801,898 A | * | 4/1974 | Young ..................... | H02H 3/16 324/509 |
| 3,976,987 A | * | 8/1976 | Anger .................... | G01R 27/18 324/509 |
| 5,990,685 A | * | 11/1999 | Nightall ................. | G01R 27/18 324/509 |

(Continued)

*Primary Examiner* — Jermele M Hollington
*Assistant Examiner* — Christopher McAndrew
(74) *Attorney, Agent, or Firm* — Muncy, Geissler, Olds & Lowe, P.C.

(57) ABSTRACT

An insulation resistance detection method and circuit for an ungrounded DC power supply systems. When the ratio of the voltage of the positive bus to that of the negative bus exceeds a preset range, the DC current is injected into the ungrounded DC power supply systems. DC power supply systems have essentially some grounded stray and external capacitors, so some of the injected DC current will flow into the grounded capacitor, increasing the voltage of the fault bus and the leakage current. The proposed method increases the leakage current by the injection of DC current, so the current sensor can detect the leakage current from which the insulation resistance can be calculated. The DC current injection method can significantly improve the detection of ground insulation faults in ungrounded DC power supply systems.

13 Claims, 9 Drawing Sheets

(56) References Cited

U.S. PATENT DOCUMENTS

| | | | | |
|---|---|---|---|---|
| 7,751,993 B2 * | 7/2010 | Mirafzal | ............ | H02H 3/16 324/500 |
| 2009/0147414 A1 * | 6/2009 | Lazarovich | ............ | H02H 9/08 361/42 |
| 2009/0147415 A1 * | 6/2009 | Lazarovich | ............ | H02H 9/08 361/42 |
| 2011/0270545 A1 * | 11/2011 | Doktar | ............ | G01R 31/025 702/58 |

* cited by examiner

INSULATION RESISTANCE DETECTION METHOD AND CIRCUIT FOR UNGROUNDED DC POWER SUPPLY SYSTEM

FIELD OF THE INVENTION

The present invention relates to an insulation resistance detection method and circuit, particularly to an insulation resistance detection method and circuit for an ungrounded DC power supply system.

BACKGROUND OF THE INVENTION

The DC power supply system normally comprises a battery group, rectifiers and power converters, supplying a high-quality DC (Direct Current) power source to critical loads. In order to promote the quality of DC power supply, the DC power supply system is normally ungrounded, i.e. the positive and negative buses thereof are insulated from the ground. A single ground fault does not arise from the system is forming a short circuit, thereby allowing it to still power to the loads. Importantly, power supply systems stop working when a ground insulation fault occurs in two or more points.

The balanced bridge detection method is a conventional means of detecting the insulation fault of ungrounded DC power supply systems, in which the ratio of the insulation resistance to ground of the positive bus to that of the negative bus is generally set as 2:1~10:1. A ground insulation fault refers to a situation in which ratio of the voltage to ground of the positive bus and that of the negative bus is higher than the above setting value. Although the positive bus and the negative bus significantly differ in the insulation value, the insulation resistance values of the positive and negative buses are not lower than that of the permitted value; the balanced bridge detection method may still create false alarms.

The unbalanced bridge detection method is a modification of balanced bridge method. This method is applicable for the positive and negative bus when their insulation resistance falls are equal, and can also detect the insulation resistance value of the positive and negative bus to ground. However, this method cannot identify which branch circuit has a ground fault, and so each branch circuit requires a branch leakage current detector. The positive and negative bus must be fitted with a resistor when using the unbalanced bridge method to detect the fault, reducing the insulation of the DC power system.

AC signal source injection method: The basic principle of this method is to inject a low frequency AC signal source in the positive and negative bus, and then use an AC current sensor to detect the low frequency AC current signal of the branch circuit. The ground resistance can then be calculated based on the magnitude and phase angle of this current. When the measured resistance value is below the set value, this branch circuit has a ground fault. Due to micro electro mechanical devices recently using numerous anti-interference capacitors as a transient voltage compensator, this increases the capacitance in the DC power supply system and results in larger capacitance current. AC signal source injection to detect ground fault point thus is ineffective for ground fault detection of a branch circuit. That is, when the ground capacitance current exceeds the leakage current value of the standard of insulation resistance, it generates a false alarm that affects the correct determination of the insulation false detection device.

Theoretically, a single point ground fault does not produce a leakage current in ungrounded DC power systems. However, DC power systems may have some grounded stray capacitors and external capacitors, thereby providing some paths for ground fault leakage current. Notably, the paths for leakage current are closed when the charges of the capacitors reach steady state. Correspondingly, deterioration of the insulation resistors can be detected via the transitory leakage current paths provided by the grounded capacitors and detection of the difference of the currents of the positive and negative buses.

With a deteriorating insulation resistance of the positive and negative buses, their voltages to ground change as well. The bus with lower ground resistance has a lower voltage to ground; the bus with a higher ground resistance has a higher voltage to ground. When the positive bus insulation resistance deteriorates, the initial value of leakage current $IGN+(t0)$ is equal to the voltage to ground of the positive bus $Vc(t0)$ divided by the insulation resistance to ground of the positive bus $RN+$, $IGN+(t0)=Vc(t0)/RN+$. The leakage current decreases to zero after the charges of grounded capacitors achieve the steady state. Thus, if grounded capacitors are used to detect a leakage current, the leakage current must be measured immediately when the insulation resistance changes. The leakage current decreases exponentially and, then, approaches zero after a period of time.

Insulation resistance of the power system does not rapidly deteriorate. Generally, these insulation resistors deteriorate gradually, and the aging speed is extremely slow. When the voltage of the fault bus to ground is inadequate, the leakage current is too low to drive the leakage current detection device. Thus, the ground insulation fault is undetected. In this case, the grounded capacitors method can not detect the ground insulation fault successfully.

For example, consider a 100 V ungrounded DC power supply system, in which the current detection sensitivity is 1 mA; a ground fault alarm signal appears after the insulation resistance decreases below 50 k$\Omega$. Initial values of the insulation resistance of positive and negative buses to ground are 500 k$\Omega$ and, then, the voltages of positive and negative buses to ground are 50 V. In this case, if the insulation resistance of positive or negative buses breaks down suddenly, the insulation resistance decreases rapidly from 500 k$\Omega$ to 49 k$\Omega$; the initial leakage current is $IGN+(0)=50$ V/49 k$\Omega=1.02$ mA; and the system creates a fault alarm signal.

The above example reveals that, if the insulation resistance of the positive bus to ground gradually decreases, its voltage to ground also decreases slowly. When the insulation resistance of the bus to ground gradually decreases to 51 k$\Omega$, its voltage to ground also decreases slowly to 9.26 V $(100/(500+51)\times51=9.26$ V). After the insulation resistance of the bus decreases further to 49 k$\Omega$, the system should have created an alarm signal because the insulation resistance is already lower than the fault threshold value of 50 k$\Omega$. However, as the insulation resistance is reduced from 51 k$\Omega$ to 49 k$\Omega$, the initial leakage current $IGN+(0)$ is only 0.19 mA $(IGN+(0)=9.26$ V/49 k$\Omega)$. Such a leakage current is too low to drive the current sensor with 1 mA sensitivity. This implies that the grounded capacitors method cannot accurately detect the ground insulation fault when the insulation resistance slowly decreases. To compensate for the inability of the current sensor to accurately detect the leakage current when the insulation resistance slowly decreases, this invention proposes a novel DC current injection method, capable of significantly improving the ground insulation fault detection ability of ungrounded DC power supply systems.

SUMMARY OF THE INVENTION

One objective of the present invention is to provide a novel insulation resistor malfunction detection circuit for a DC power supply system to overcome the problem that the conventional technology cannot high-sensitively detect leakage current in a ground fault of an ungrounded power supply system and the problem that the conventional grounded capacitors method cannot detect gradual deterioration of the insulation resistor.

In order to achieve the abovementioned objective, the present invention proposes an insulation resistance detection method for an ungrounded DC power supply system, which comprises steps: measuring a voltage of a positive bus of a power supply system with respect to a ground terminal (PB-G voltage), and measuring a voltage of a negative bus with respect to a ground terminal (NB-G voltage); dividing the PB-G voltage by the NB-G voltage to have a ratio, getting an absolute of the ratio, and determining whether the absolute value exceeds a preset range; if the ratio is below the preset range, using a power conversion unit to inject a DC current into a circuit between the positive bus and the ground terminal to boost the PB-G voltage to a rated value; if the ratio is above the preset range, using a power conversion unit to inject a DC current into a circuit between the negative bus and the ground terminal to boost the absolute value of the NB-G voltage to a rated value.

The present invention also proposes an insulation resistance detection circuit for an ungrounded DC power supply system, which comprises a power supply system including a positive bus, a negative bus and at least one ground terminal, and connected with at least one load; a first ground capacitor having a terminal connected with the positive bus and another terminal connected with the ground terminal; a second ground capacitor having a terminal connected with the negative bus and another terminal connected with the ground; a power conversion unit, wherein the input terminal of the power conversion unit is connected with the positive bus and the negative bus (or further connected with another power supply system), and wherein the output terminal of the power conversion unit is connected with the positive bus and the ground terminal; a control/processing unit connected with the power conversion unit; two voltage detection units connected with the first ground capacitor, the second ground capacitor and the control/processing unit; and at least one current detection unit connected with the power supply system and the control/processing unit.

The present invention is characterized in: injecting a DC current to increase leakage current. Thus, the current detector can easily detect the value of the leakage current, and the insulation resistance with respect to the ground can be calculated from the voltage and the leakage current. Therefore, the present invention can effectively increase the ability to detect the malfunction of the insulation resistor of an ungrounded DC power supply system.

DETAILED DESCRIPTION OF THE PREFERRED EMBODIMENTS

Figure 1:
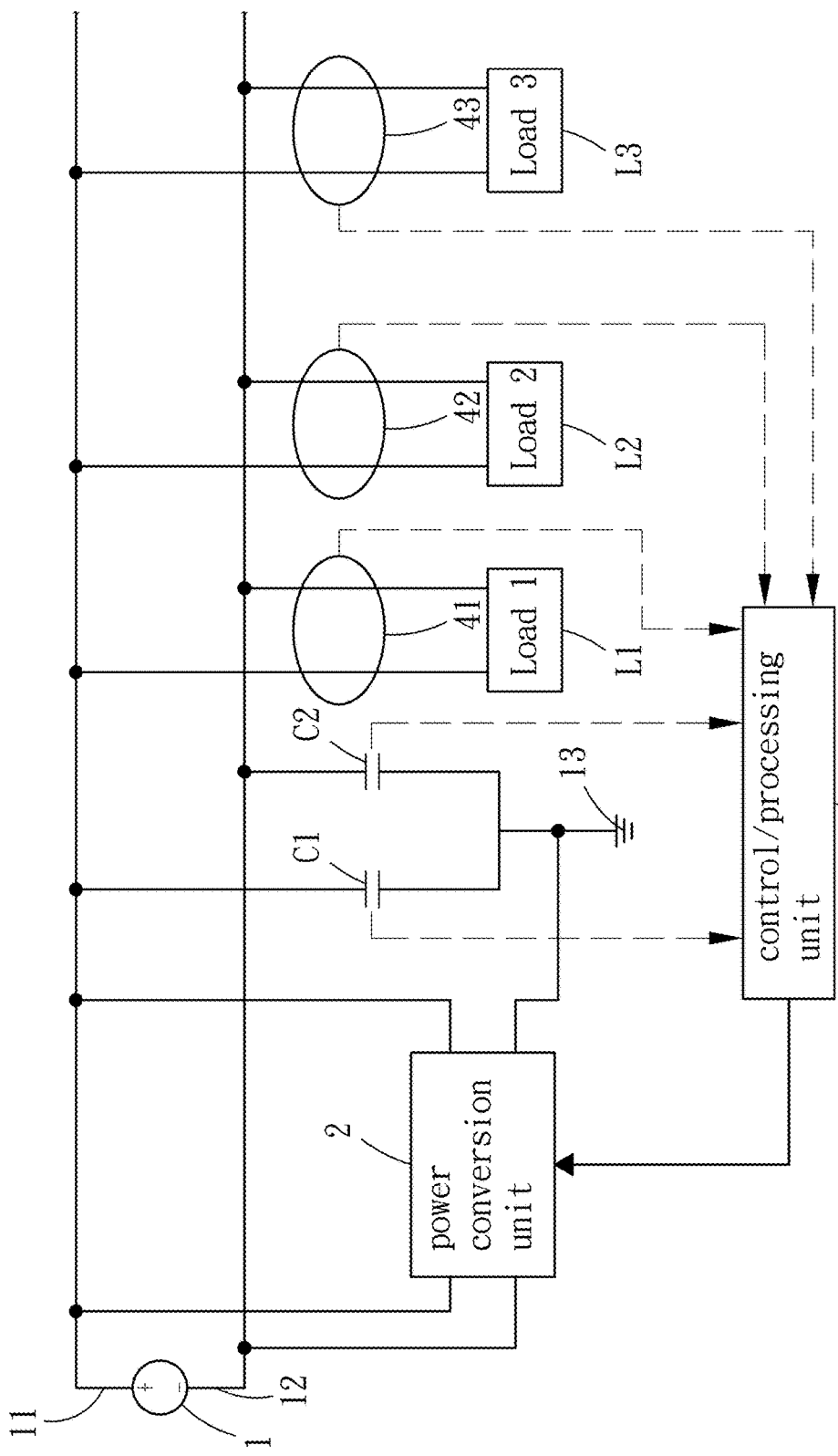
FIG. 1 schematically shows an insulation resistance detection circuit for an ungrounded DC power supply system according to one embodiment of the present invention.

Refer to FIG. 1 for an insulation resistance detection circuit for an ungrounded DC power supply system according to one embodiment of the present invention. According to FIG. 1, the method and circuit of the present invention is to be described in detail thereinafter.

The insulation resistance detection circuit for an ungrounded DC power supply system of the present invention comprises a power supply system 1; a first ground capacitor C1; a second ground capacitor C2; a power conversion unit 2; a control/processing unit 3; two voltage detection units (not shown in the drawings); a plurality of current detection units 41, 42 and 43; and an alert unit (not shown in the drawings). The power supply system 1 includes a positive bus 11, a negative bus 12, and at least one ground terminal 13. The power supply system 1 is connected with at least one load. In the embodiment shown in FIG. 1, the power supply system 1 is connected with three loads, Load 1, Load 2 and Load 3.

One terminal of the first ground capacitor C1 is connected with the positive bus 11, and another terminal of the first ground capacitor C1 is connected with the ground terminal 13. One terminal of the second ground capacitor C2 is connected with the negative bus 12, and another terminal of the second ground capacitor C2 is connected with the ground terminal 13. While the positive bus 11 or the negative bus 12 malfunctions, the power conversion unit 2 injects current to charge the first ground capacitor C1 or the second ground capacitor C2 to increase the voltage with respect to the ground terminal 13 for the positive bus 11 or the negative bus 12. The first ground capacitor C1 or the second ground capacitor C2 also provides a path for leakage current while the insulation faults The input terminal of the power conversion unit 2 is connected with the positive bus 11 and the negative bus 12 (or further connected with another power supply system). The output terminal of the power conversion unit 2 is connected with the positive bus 11 and the ground terminal 13. The power conversion unit 2 functions to inject DC current into the positive bus 11 or the negative bus 12 while the insulation resistor malfunctions. In some embodiments, the power conversion unit 2 is realized by two unidirectional DC/DC converters or a bidirectional DC/DC converter. In the embodiment shown in FIG. 1, a bidirectional DC/DC converter is used to exemplify the power conversion unit 2.

The control/processing unit 3 is connected with the power conversion unit 2. In some embodiments, the control/processing unit 3 is a single-chip processor or a digital signal processor (DSP). However, the present invention does not limit that the control/processing unit 3 must be a single-chip processor or a digital signal processor. In the specification, a digital signal processor is used to exemplify the control/processing unit 3. The two voltage detection units are connected with the control/processing unit 3 and respectively connected with the first ground capacitor C1 and the second ground capacitor C2, whereby the voltage signals of the first ground capacitor C1 and the second ground capacitor C2 can be transmitted to the control/processing unit 3.

The current detection units 41, 42 and 43 are corresponding to Load 1, Load 2 and Load 3 and realized with DC leakage current detectors. The current detection units 41, 42 and 43 are respectively connected with Load 1, Load 2 and Load 3 of the branch circuits of the power supply system 1 to detect the leakage currents of the branch circuits. The current detection units 41, 42 and 43 are also connected with the control/processing unit 3, whereby the control/processing unit 3 can receives the values of the leakage currents respectively occurring in the branch circuits. The alert unit is connected with the control/processing unit 3, emitting an alert while the ground insulation fault is confirmed.

Figure 2A:
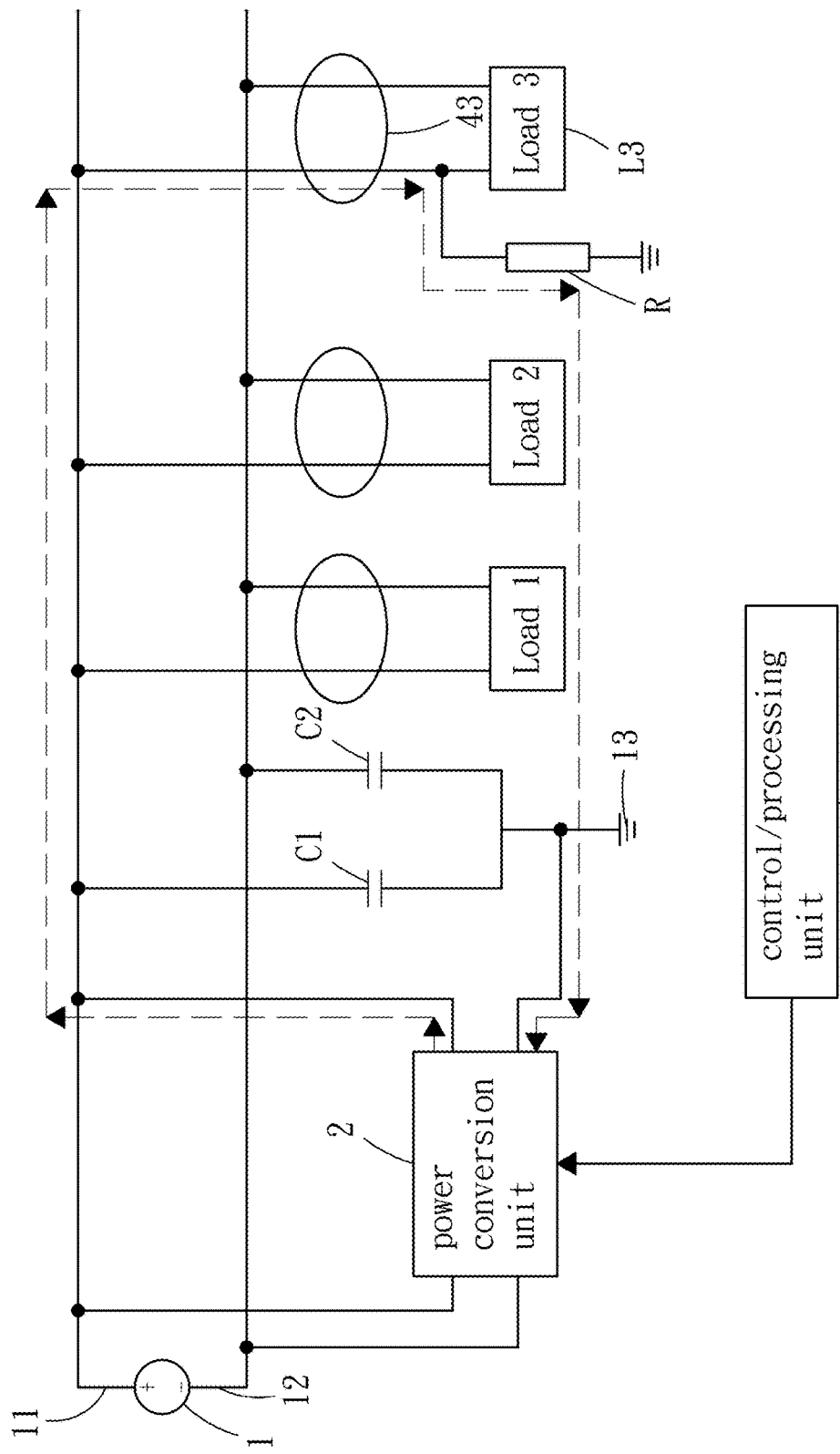
FIG. 2A schematically shows a path where DC current is injected into the positive bus of an insulation resistance detection circuit for an ungrounded DC power supply system according to one embodiment of the present invention.
Figure 2B:
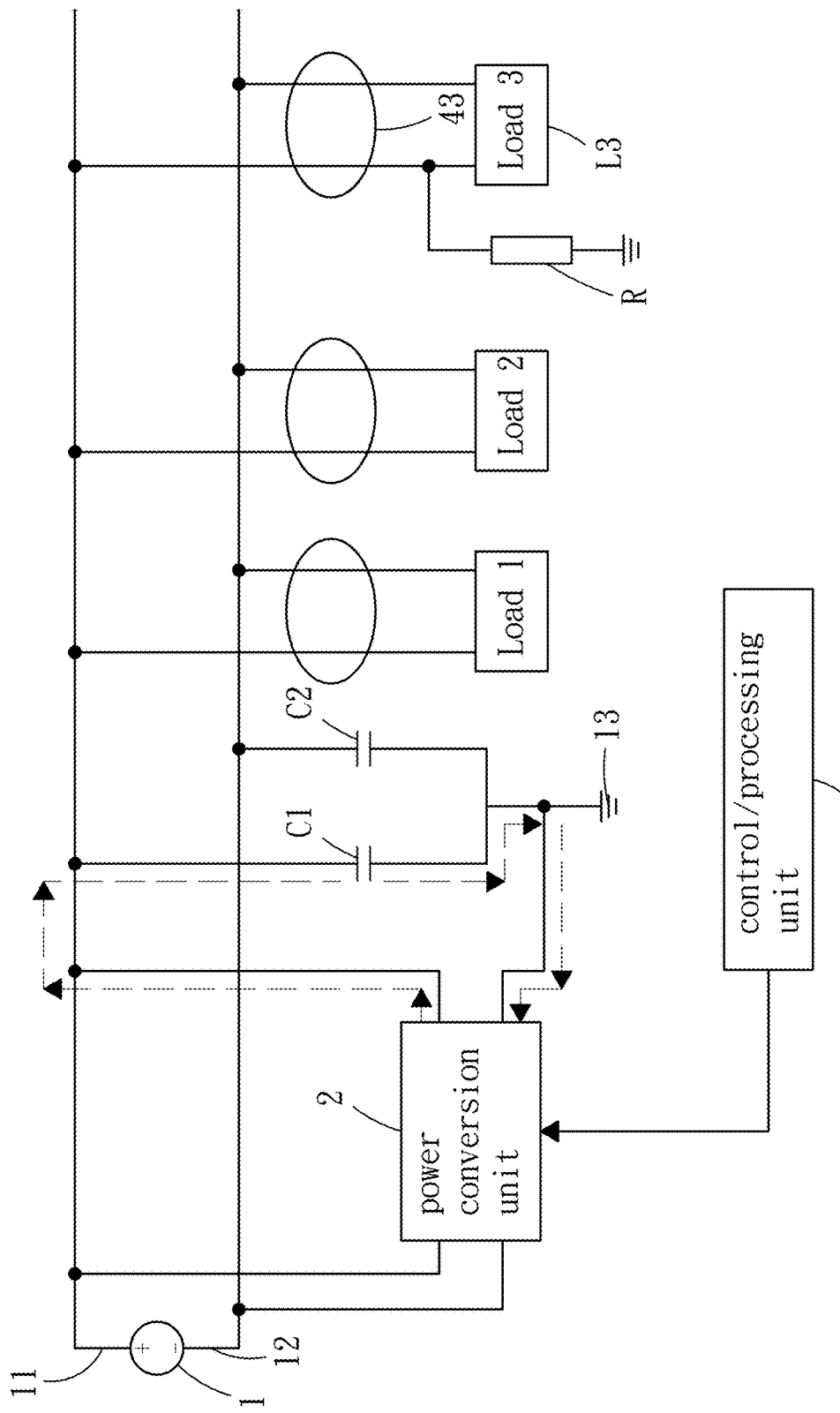
FIG. 2B schematically shows another path where DC current is injected into the positive bus of an insulation resistance detection circuit for an ungrounded DC power supply system according to one embodiment of the present invention.
Figure 2C:
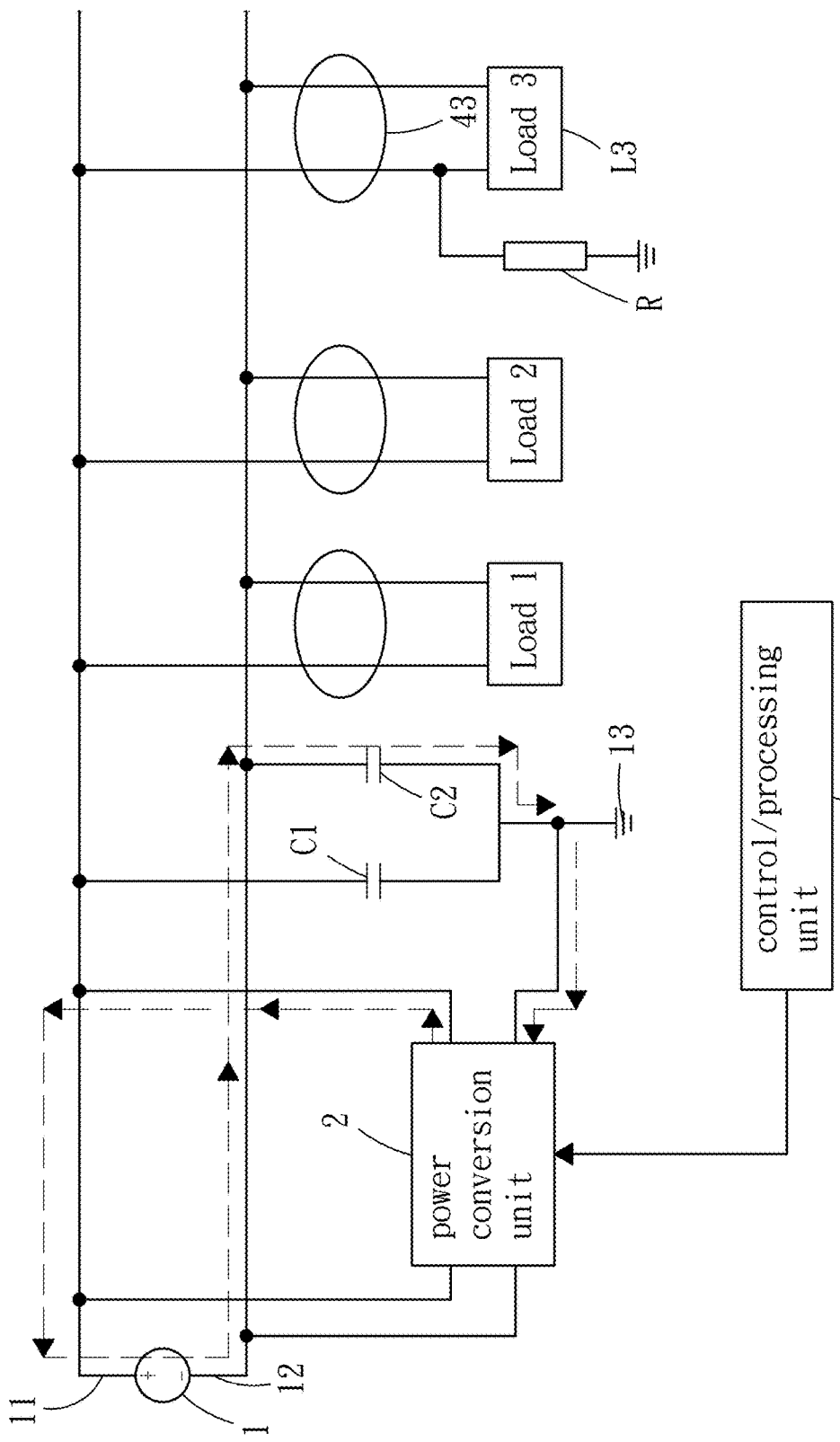
FIG. 2C schematically shows a further path where DC current is injected into the positive bus of an insulation resistance detection circuit for an ungrounded DC power supply system according to one embodiment of the present invention.

Refer to FIGS. 2A-2C, and refer to FIG. 1 again. The insulation resistance detection method for an ungrounded DC power supply system of the present invention comprises steps: measuring a PB-G voltage and an NB-G voltage, wherein the PB-G voltage is defined as a voltage of a positive bus 11 of a power supply system 1 with respect to a ground terminal 13, and the NB-G voltage is defined as a voltage of a negative bus 12 of the power supply system 1 with respect to the ground terminal 13, i.e. measuring the voltages of the first ground capacitor C1 and the second ground capacitor C2; dividing the PB-G voltage by the NB-G voltage to have a ratio, getting an absolute of the ratio, and determining whether the absolute value of the ratio exceeds a preset range, e.g. 3/1-1/3; if the absolute value of the ratio of the PB-G voltage to the NB-G voltage is below the preset range, e.g. the absolute value of the ratio is smaller than 1/3, using a power conversion unit 2 to inject a DC current into the circuit between the positive bus 11 and the ground terminal 13 to boost the PB-G voltage to a rated value (the rated value is a half of the voltage of the power supply system 1); if the absolute value of the ratio of the PB-G voltage to the NB-G voltage is above the preset range, e.g. the absolute value of the ratio is larger than 3/1, using the power conversion unit 2 to inject a DC current into the circuit between the negative bus 12 and the ground terminal 13 to boost the NB-G voltage to have an absolute value equal to the rated value.

The PB-G voltage plus the absolute value of the NB-G voltage is equal to the voltage of the power supply system 1. While power conversion unit 2 injects a DC current to boost the PB-G voltage, the absolute value of the NB-G voltage decreases. While the PB-G voltage increases, the leakage current also increases. Thus, the current detection unit 43 can easily detect the value of the current in the ground fault. Thereby, the insulation resistance between the fault bus and the ground terminal 13 can be easily worked out.

Refer to FIG. 1 and FIGS. 2A-2C again. The method of the present invention further comprises a step: determining whether the voltage of the first ground capacitor C1 is equal to the voltage of the second ground capacitor C2 and equal to a half of the voltage of the power supply system 1, or determining whether a current detection units 41, 42 or 43 detects leakage current. If the voltage of the first ground capacitor C1 is equal to the voltage of the second ground capacitor C2 and equal to a half of the voltage of the power supply system 1, the power conversion unit 2 is turned off to stop injecting DC current. If the current detection unit 41, 42 or 43 detects leakage current, the power conversion unit 2 is turned off to stop injecting DC current. It is further described in detail below.

When a serious insulation fault occurs on the system e.g., a short circuit between the positive bus 11 and ground terminal 13, or an extremely insulation resistance of the positive bus, the DC current injected by the power conversion unit 2 to the positive bus 11 flows into the short circuit point. Therefore, voltage of the positive bus to ground does not reach the rated value. A situation in which voltage of the positive bus 11 to ground terminal 13 does not increase further implies that all of the injected DC current flows into the short circuit point. Then, the ground fault current is equal to the injected current. Once the current sensor detects a leakage current, the power conversion unit 2 is turned off to stop the leakage current.

If the insulation resistor malfunctions slightly, for example, the leakage current of the malfunctioning point of the insulation resistor between the positive bus 11 and the ground terminal is smaller than the current output by the power conversion unit 2, the excess current is injected into the first ground capacitor C1 to increase the PB-G voltage and decrease the absolute value of the NB-G voltage until the voltages of the first ground capacitor C1 and the second ground capacitor C2 reach the rated values. Alternatively, once the current detection unit 43 detects leakage current, the power conversion unit 2 is turned off to shorten the duration of the leakage current. In brief, the present invention uses the current path involving the power conversion unit 2, the fault point of grounding, the first ground capacitor C1 and the second ground capacitor C2 to create a transient leakage current and uses the leakage current to detect the ground insulation resistance.

Figure 3A:
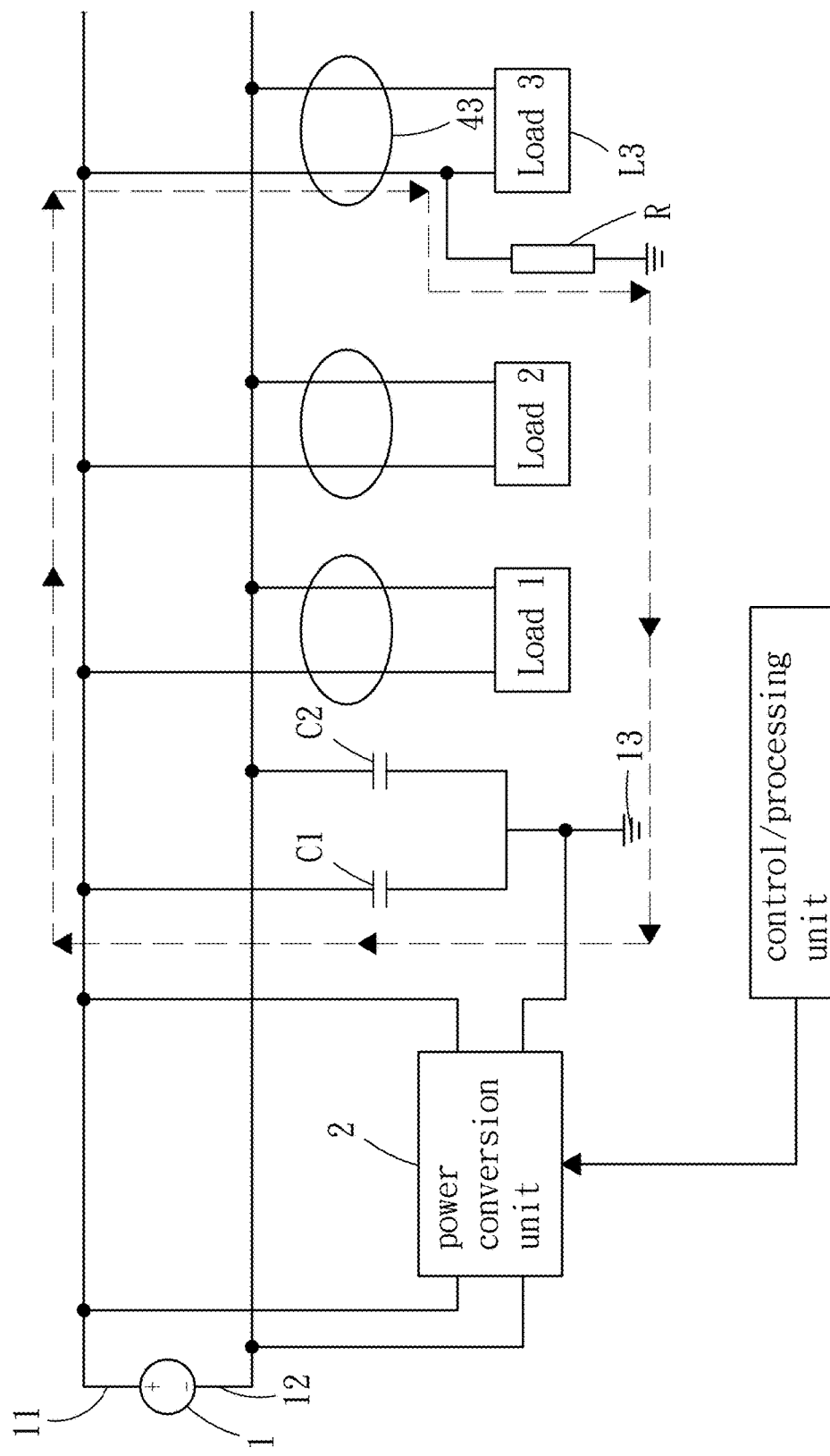
FIG. 3A schematically shows a leakage current path appearing when a ground fault occurs in the positive bus of an insulation resistance detection circuit for an ungrounded DC power supply system according to one embodiment of the present invention.
Figure 3B:
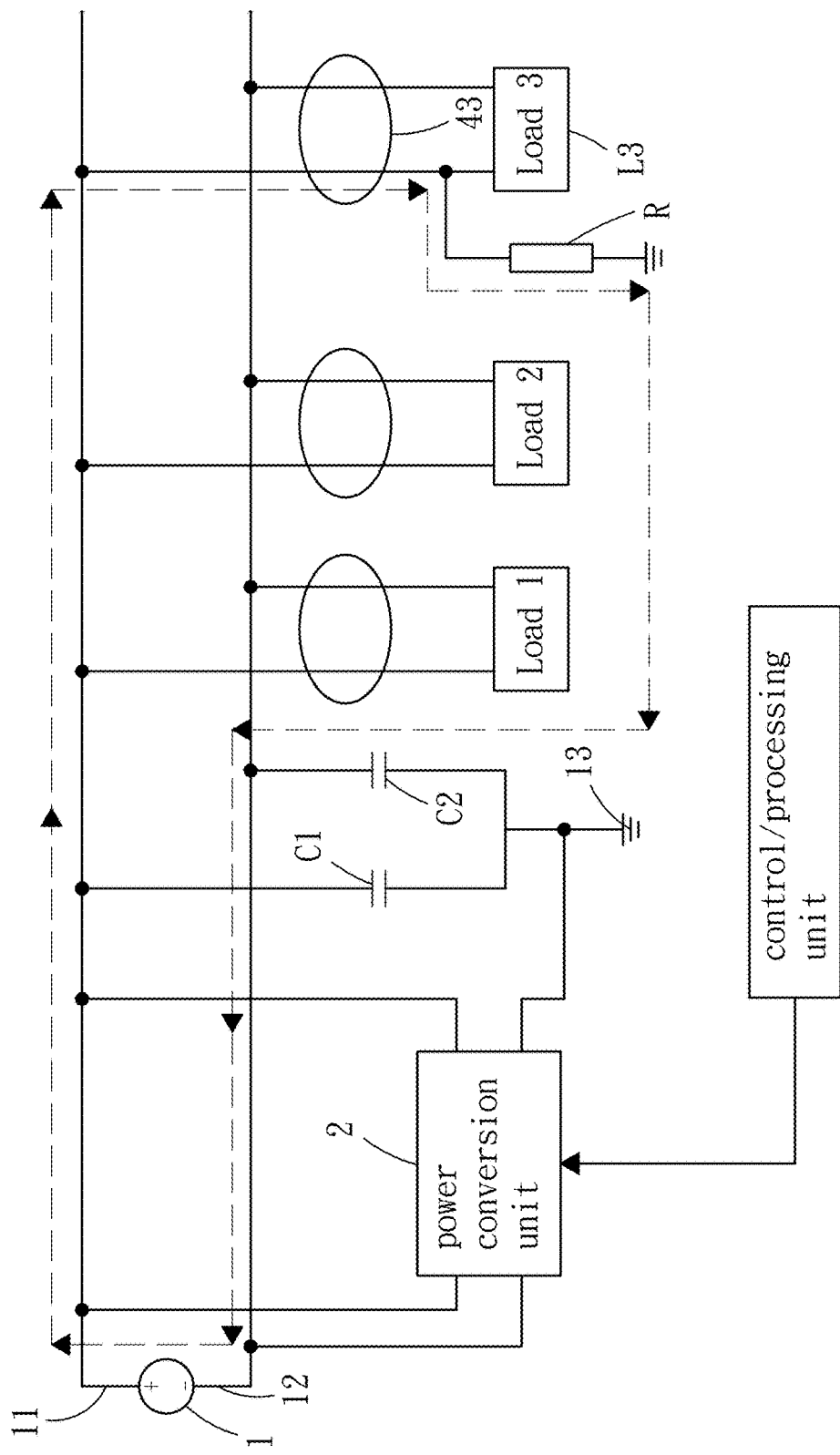
FIG. 3B schematically shows another leakage current path appearing when a ground fault occurs in the positive bus of an insulation resistance detection circuit for an ungrounded DC power supply system according to one embodiment of the present invention.

In the normal state, the voltage of the first ground capacitor C1 is equal to the voltage of the second ground capacitor C2 and equal to a half of the voltage of the power supply system 1. While the insulation of the positive bus 11 deteriorates, the voltage of the second ground capacitor C2 is larger than the voltage of the first ground capacitor C1. While the insulation of the negative bus 12 deteriorates, the voltage of the first ground capacitor C1 is larger than the voltage of the second ground capacitor C2. While the power conversion unit 2 is turned off, the leakage current is supplied by the charges stored in the first ground capacitor C1 and the second ground capacitor C2. Refer to FIG. 3A. The first path of the leakage current is as follows: the leakage current supplied by the charges of the first ground capacitor C1 flows through the positive bus 11 and the ground fault point and then flows back to the first ground capacitor C1. While the deterioration of the grounding insulation of the positive bus 11 occurs, the charges stored in the first ground capacitor C1 discharge. Thus, the charges of the first ground capacitor C1 decease gradually, the voltage thereof also drops gradually. Finally, the first ground capacitor C1 reaches steady-state equilibrium and has a lower voltage, not releasing charges any more. It means that the first path of the leakage current is interrupted. Refer to FIG. 3B. The second path of the leakage current is as follows: the current flows from the DC power source through the insulation resistor R of the fault point to the second ground capacitor C2 to charge the second ground capacitor C2 and then returns from the second ground capacitor C2 to the DC power source. As the second ground capacitor C2 is charged by the current, the voltage thereof increases. Finally, the second ground capacitor C2 reaches steady-state equilibrium and has a higher voltage.

Figure 4A:
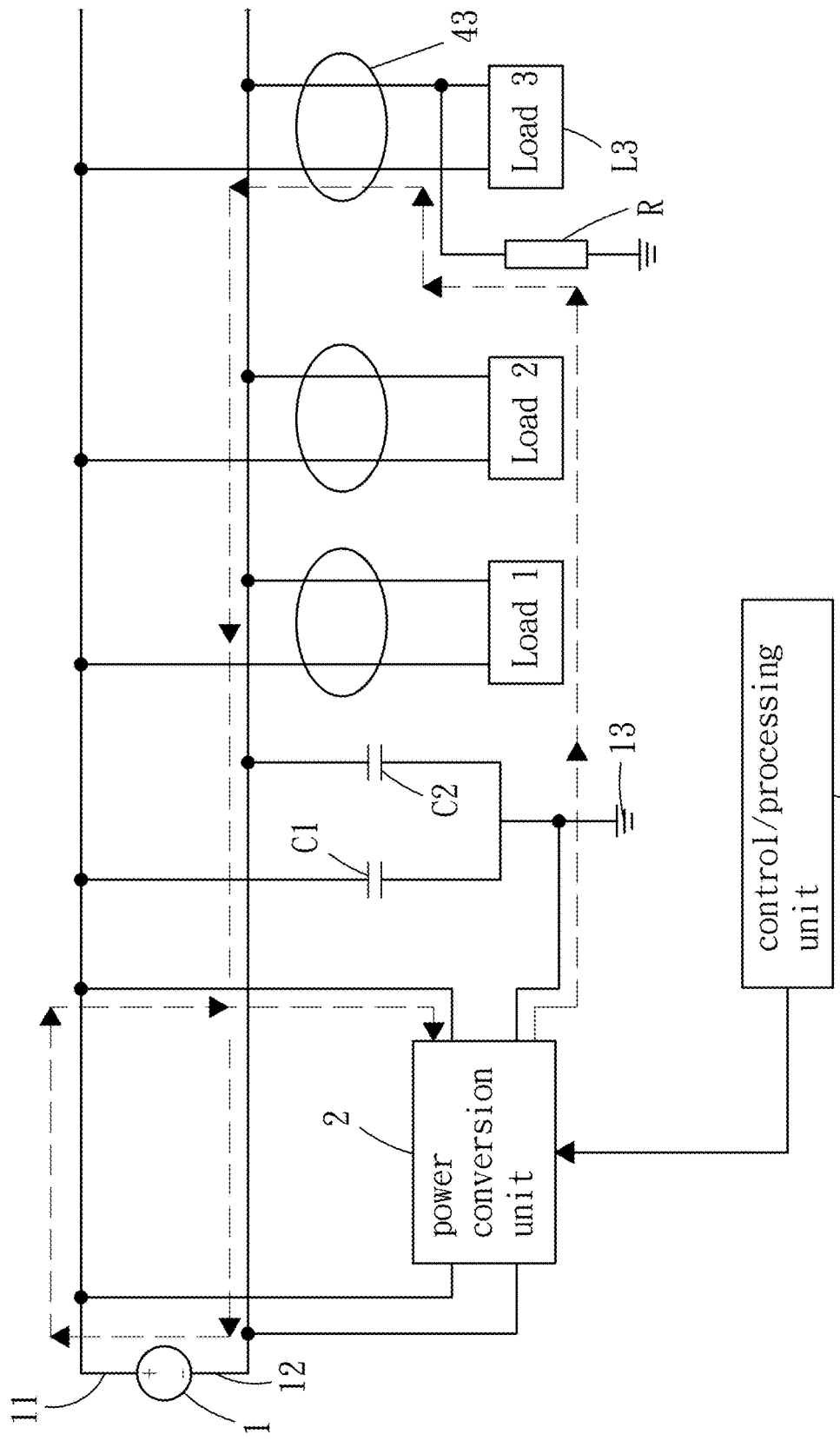
FIG. 4A schematically shows a path where DC current is injected into the negative bus of an insulation resistance detection circuit for an ungrounded DC power supply system according to one embodiment of the present invention.
Figure 4B:
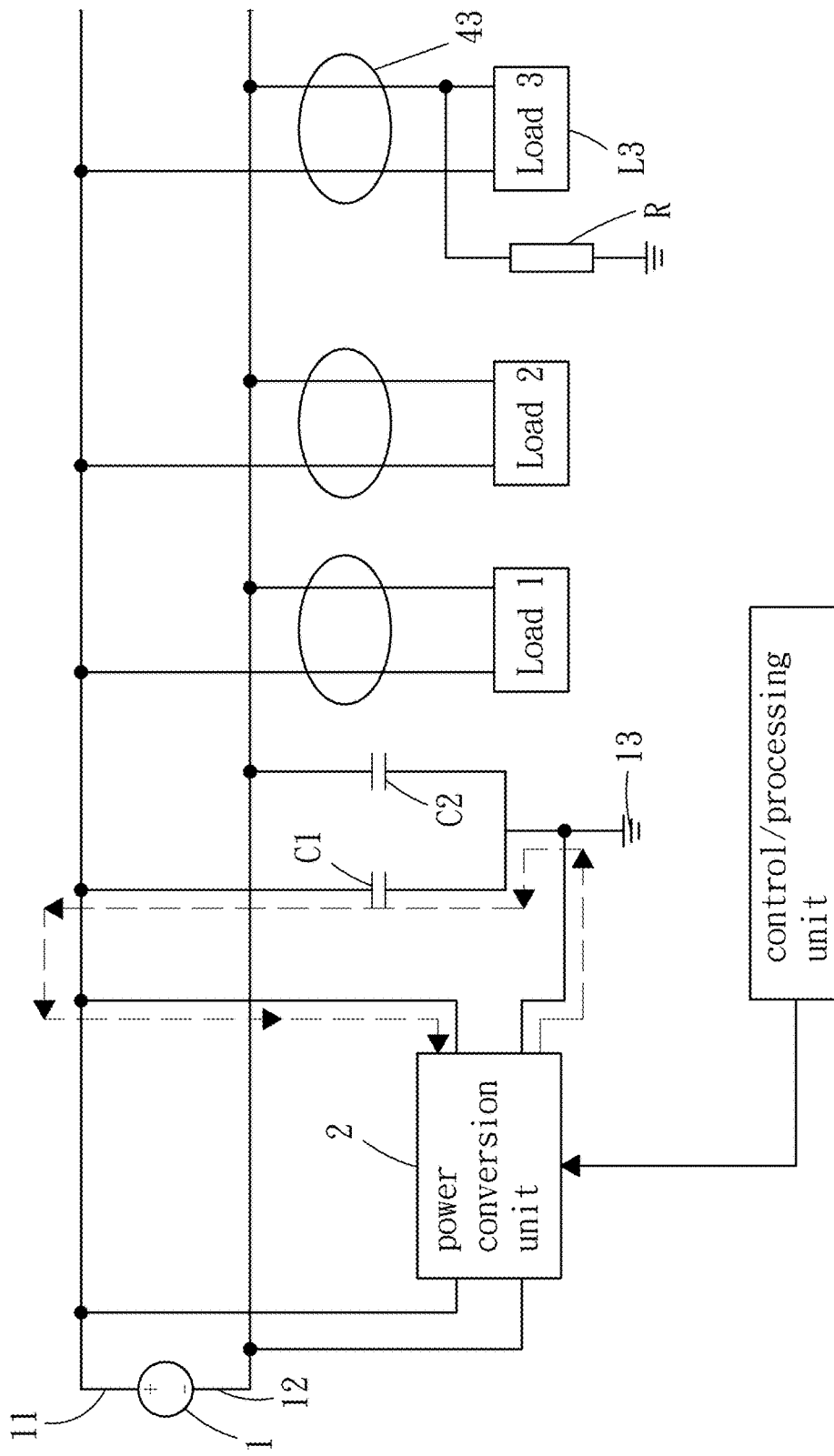
FIG. 4B schematically shows another path where DC current is injected into the negative bus of an insulation resistance detection circuit for an ungrounded DC power supply system according to one embodiment of the present invention.
Figure 4C:
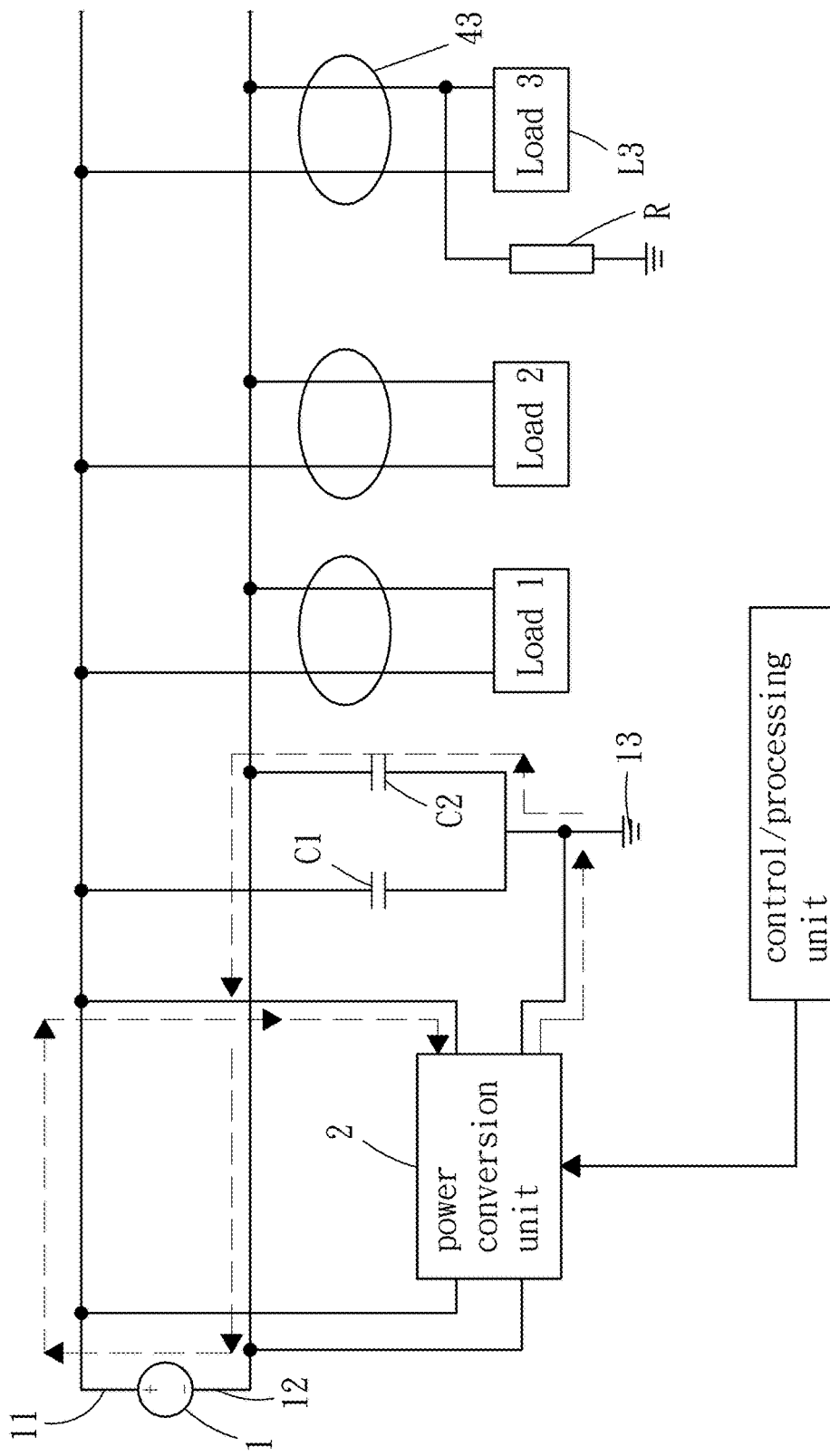
FIG. 4C schematically shows a further path where DC current is injected into the negative bus of an insulation resistance detection circuit for an ungrounded DC power supply system according to one embodiment of the present invention.

Refer to FIGS. 4A-4C. If the ground resistor R of the negative bus 12 deteriorates, the NB-G voltage decreases, and the PB-G voltage increases. Once the ratio of the PB-G voltage to the absolute value of the NB-G voltage is above the preset range, DC current is injected into the ground terminal 13 and the negative bus 12 to increase the absolute value of the NB-G voltage to the rated value. The theory is the same as that of injecting DC current into the positive bus 11 and will not repeat herein.

In conclusion, DC power supply systems have essentially some grounded stray and external capacitors. A portion of the injected DC current will flows into the ground capacitors to boost the bus-ground voltage and thus increase the leakage current proportionally with the increased voltage. The present invention makes use of the characteristic and injects DC current to increase the leakage current. Thereby, the present invention can use the current detection units to easily detect the leakage current and uses the voltage and the detected leakage current to work out the ground resistance. Therefore, the DC current injection method can significantly improve the detection of ground insulation faults in ungrounded DC power supply systems.

What is claimed is:

1. An insulation resistance detection method for an ungrounded direct-current (DC) power supply system, comprising following steps of:
    measuring a voltage of a positive bus of the power supply system with respect to a ground terminal (PB-G voltage) by one voltage detection unit and a voltage of a negative bus of the power supply system with respect to the ground terminal (NB-G voltage) by another voltage detection unit, wherein the PB-G voltage is defined as a voltage of a positive bus of a power supply system with respect to a ground terminal, and the NB-G voltage is defined as a voltage of a negative bus of the power supply system with respect to the ground terminal;
    dividing the PB-G voltage by the NB-G voltage to have a ratio, getting an absolute of the ratio, and determining whether the absolute value of the ratio exceeds a preset range by a control/processing unit;
    using a power conversion unit controlled by the control/processing unit to inject a DC (Direct Current) current into a circuit between the positive bus and the ground terminal to boost the PB-G voltage to a rated value if the absolute value of the ratio is below the preset range; or using the power conversion unit controlled by the control/processing unit to inject a DC current into a circuit between the negative bus and the ground terminal to boost the NB-G voltage to have an absolute value equal to the rated value if the absolute value of the ratio is above the preset range.

2. The insulation resistance detection method for an ungrounded DC power supply system according to claim 1 further comprising a step of:
    determining whether a voltage of a first ground capacitor is equal to a voltage of a second ground capacitor and equal to a half of a voltage of the power supply system; if yes, shutting down the power conversion unit to stop injecting DC current.

3. The insulation resistance detection method for an ungrounded DC power supply system according to claim 1 further comprising a step of:
    determining whether a current detection unit detects leakage current; if yes, shutting down the power conversion unit to stop injecting DC current.

4. The insulation resistance detection method for an ungrounded DC power supply system according to claim 1 further comprising a step of:
    using an alert unit to emit an alert while a current detection unit detects leakage current.

5. The insulation resistance detection method for an ungrounded DC power supply system according to claim 2 further comprising a step of:
    using an alert unit to emit an alert while a current detection unit detects leakage current.

6. The insulation resistance detection method for an ungrounded DC power supply system according to claim 3 further comprising a step of:
    using an alert unit to emit an alert while the current detection unit detects leakage current.

7. The insulation resistance detection method for an ungrounded DC power supply system according to claim 1, wherein the power conversion unit is realized by two unidirectional DC/DC converters or a bidirectional DC/DC converter.

8. The insulation resistance detection method for an ungrounded DC power supply system according to claim 2, wherein the power conversion unit is realized by two unidirectional DC/DC converters or a bidirectional DC/DC converter.

9. The insulation resistance detection method for an ungrounded DC power supply system according to claim 3, wherein the power conversion unit is realized by two unidirectional DC/DC converters or a bidirectional DC/DC converter.

10. An insulation resistance detection circuit for an ungrounded DC power supply system, comprising
    a power supply system including a positive bus, a negative bus and at least one ground terminal, and connected with at least one load;
    a first ground capacitor, wherein one terminal of the first ground capacitor is connected with the positive bus, and another terminal of the first ground capacitor is connected with the ground terminal;
    a second ground capacitor, wherein one terminal of the second ground capacitor is connected with the negative bus, and another terminal of the second ground capacitor is connected with the ground terminal;
    a power conversion unit, wherein an input terminal of the power conversion unit is connected with the positive bus and the negative bus, and an output terminal of the power conversion unit is connected with the positive bus and the ground terminal;

a control/processing unit connected with the power conversion unit;

two voltage detection units respectively connected with the first ground capacitor, the second ground capacitor ground, the ground terminal and the control/processing unit, wherein one of the voltage detection units measures a voltage of a positive bus of the power supply system with respect to a ground terminal (PB-G voltage), and another one of the voltage detection units measures a voltage of a negative bus of the power supply system with respect to the ground terminal (NB-G voltage);

at least one current detection unit connected with the control/processing unit and the load of the power supply system;

wherein the control/processing unit divides the PB-G voltage by the NB-G voltage to obtain a ratio, determines an absolute value of the ratio, and determines whether the absolute value of the ratio exceeds a preset range, the control/processing unit controlling the power conversion unit to inject a DC (Direct Current) current into a circuit between the positive bus and the ground terminal to boost the PB-G voltage to a rated value if the absolute value of the ratio is below the preset range; or controlling the power conversion unit to inject a DC current into a circuit between the negative bus and the ground terminal to boost the NB-G voltage to have an absolute value equal to the rated value if the absolute value of the ratio is above the preset range.

11. The insulation resistance detection circuit for an ungrounded DC power supply system according to claim 10 further comprising an alert unit connected with the control/processing unit.

12. The insulation resistance detection circuit for an ungrounded DC power supply system according to claim 10, wherein the power conversion unit is realized by two unidirectional DC/DC converters or a bidirectional DC/DC converter.

13. The insulation resistance detection circuit for an ungrounded DC power supply system according to claim 10, wherein the input terminal of the power conversion unit is further connected with a power source of another power supply system.

* * * * *